(12) United States Patent
Laske et al.

(10) Patent No.: US 10,474,040 B2
(45) Date of Patent: Nov. 12, 2019

(54) SYSTEMS AND METHODS FOR DEVICE-CORRELATED OVERLAY METROLOGY

(71) Applicant: KLA-Tencor Corporation, Milpitas, CA (US)

(72) Inventors: Frank Laske, Weilburg (DE); Ulrich Pohlmann, Jena (DE); Stefan Eyring, Weilburg (DE); Nadav Gutman, Zichron Ya'aqov (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/009,939

(22) Filed: Jun. 15, 2018

(65) Prior Publication Data

US 2019/0179231 A1     Jun. 13, 2019

Related U.S. Application Data

(60) Provisional application No. 62/595,987, filed on Dec. 7, 2017.

(51) Int. Cl.
*G03B 27/32* (2006.01)
*G03B 27/42* (2006.01)
(Continued)

(52) U.S. Cl.
CPC ........ *G03F 7/70633* (2013.01); *G01B 11/272* (2013.01); *G01B 15/00* (2013.01); *G01B 2210/56* (2013.01)

(58) Field of Classification Search
CPC ........ G01B 11/26; G01B 11/272; G01B 5/24; G03F 7/70633; G03F 1/42; G03F 1/84;
(Continued)

(56) References Cited

U.S. PATENT DOCUMENTS

| | | | |
|---|---|---|---|
| 7,236,244 B1 * | 6/2007 | Yang | ...................... G03F 9/7065 257/797 |
| 7,541,201 B2 | 6/2009 | Ghinovker | |
| | | (Continued) | |

FOREIGN PATENT DOCUMENTS

| | | |
|---|---|---|
| WO | 2007040855 A1 | 4/2007 |
| WO | 2018004511 A1 | 1/2018 |

OTHER PUBLICATIONS

International Search Report dated Apr. 19, 2019 for PCT/US2018/064145.

*Primary Examiner* — Mesfin T Asfaw
(74) *Attorney, Agent, or Firm* — Suiter Swantz pc llo

(57) ABSTRACT

An overlay metrology system may measure a first-layer pattern placement distance between a pattern of device features and a pattern of reference features on a first layer of an overlay target on a sample. The system may further measure, subsequent to fabricating a second layer including at least the pattern of device features and the pattern of reference features, a second-layer pattern placement distance between the pattern of device features and the pattern of reference features on the second layer. The system may further measure a reference overlay based on relative positions of the pattern of reference features on the first layer and the second layer. The system may further determine a device-relevant overlay for the pattern of device-scale features by adjusting the reference overlay with a difference between the first-layer pattern placement distance and the second-layer pattern placement distance.

36 Claims, 7 Drawing Sheets

(51) Int. Cl.
*G03F 7/20* (2006.01)
*G01B 15/00* (2006.01)
*G01B 11/27* (2006.01)

(58) Field of Classification Search
CPC ...... G03F 7/70683; G03F 7/20; G03F 9/7015; H01L 2223/54426
See application file for complete search history.

(56) References Cited

U.S. PATENT DOCUMENTS

| | | |
|---|---|---|
| 8,214,317 B2 | 7/2012 | Aguilar et al. |
| 8,330,281 B2 | 12/2012 | Ghinovker et al. |
| 9,476,698 B2 | 10/2016 | Abdulhalim et al. |
| 9,704,238 B2 | 7/2017 | Eyring et al. |
| 2001/0055720 A1 | 12/2001 | Sato et al. |
| 2003/0021467 A1 | 1/2003 | Adel et al. |
| 2004/0169861 A1 | 9/2004 | Mieher et al. |
| 2005/0068515 A1 | 3/2005 | Bauch et al. |
| 2007/0008533 A1 | 1/2007 | Ghinovker |
| 2013/0035888 A1 | 2/2013 | Kandel et al. |
| 2015/0316859 A1 | 11/2015 | Huang et al. |
| 2016/0223322 A1* | 8/2016 | Liu .................... G03F 7/70633 |

\* cited by examiner

300

| 302a<br>DEVICE PATTERN | 302b<br>DEVICE PATTERN | 302c<br>DEVICE PATTERN |
|---|---|---|
| 304a<br>REFERENCE PATTERN | 302d<br>DEVICE PATTERN | 304b<br>REFERENCE PATTERN |
| 302e<br>DEVICE PATTERN | 302f<br>DEVICE PATTERN | 302g<br>DEVICE PATTERN |

FIG.3

SYSTEMS AND METHODS FOR DEVICE-CORRELATED OVERLAY METROLOGY

CROSS-REFERENCE TO RELATED APPLICATION

The present application claims the benefit under 35 U.S.C. § 119(e) of U.S. Provisional Application Ser. No. 62/595,987, filed Dec. 7, 2017, entitled SPECIAL TARGET STRUCTURES TO MEASURE DEVICE OVERLAY USING A HIGH RESOLUTION SYSTEM, naming Frank Laske, Ulrich Pohlmann, Stefan Eyring and Nadav Gutman as inventors, which is incorporated herein by reference in the entirety.

TECHNICAL FIELD

The present disclosure relates generally to overlay metrology and, more particularly, to overlay metrology targets for device-correlated overlay metrology.

BACKGROUND

Semiconductor fabrication typically requires fabricating multiple layers on a structure in which some or all of the layers include patterned features. Overlay metrology is the measurement of the relative positions of structures on various layers of a sample, which are critical to the performance of a fabricated device and must typically be controlled within tight tolerances. For example, overlay metrology may measure the relative positions of features on different sample layers as a measure of the layer-by-layer alignment of fabrication tools.

Not all device feature layouts are amenable to direct overlay measurements. Further, overlay measurements may damage or otherwise affect the performance of device features. Accordingly, overlay measurements are commonly performed on dedicated overlay targets having features designed for sensitive overlay measurements rather than directly on device features. However, differences in size, orientation, density, and/or location on the sample of overlay targets relative to the device features may introduce a mismatch between measured overlay at the target and actual overlay of device features. For example, features on different layers of overlay targets are commonly spatially separated to avoid overlap and facilitate measurements of features on buried layers. However, open areas associated with spatially separated features may not be compatible with microelectronics fabrication. Further, device features commonly include stacked structures such that overlay measurements of spatially separated features may introduce measurement errors.

Accordingly, ensuring device-relevant overlay measurements on overlay targets remains an ongoing challenge in overlay metrology.

SUMMARY

An overlay metrology system is disclosed in accordance with one or more illustrative embodiments of the present disclosure. In one illustrative embodiment, the system includes a controller to measure a first-layer pattern placement distance between a pattern of device features and a pattern of reference features on a first layer of an overlay target on a sample. In another illustrative embodiment, the controller measures, subsequent to fabricating a second layer including at least the pattern of device features and the pattern of reference features, a second-layer pattern placement distance between the pattern of device features and the pattern of reference features on the second layer. In another illustrative embodiment, the controller measures a reference overlay based on relative positions of the pattern of reference features on the first layer and the second layer in which dimensions of the pattern of reference features on the first layer are resolvable by an imaging system through the second layer. In another illustrative embodiment, the controller determines a device-relevant overlay for the pattern of device-scale features by adjusting the reference overlay with a difference between the first-layer pattern placement distance and the second-layer pattern placement distance.

An overlay metrology system is disclosed in accordance with one or more illustrative embodiments of the present disclosure. In one illustrative embodiment, the system includes an imaging system. In another illustrative embodiment, the system includes a controller communicatively coupled to the imaging system. In another illustrative embodiment, the controller measures a first-layer pattern placement distance between a pattern of device features and a pattern of reference features on a first layer of an overlay target on a sample after fabricating the first layer. In another illustrative embodiment, the controller measures, subsequent to fabricating a second layer including at least the pattern of device features and the pattern of reference features, a second-layer pattern placement distance between the pattern of device features and the pattern of reference features on the second layer. In another illustrative embodiment, the controller measures a reference overlay based on relative positions of the pattern of reference features on the first layer and the second layer in which dimensions of the pattern of reference features on the first layer are resolvable by the imaging system through the second layer. In another illustrative embodiment, the controller determines a device-relevant overlay for the pattern of device-scale features by adjusting the reference overlay with a difference between the first-layer pattern placement distance and the second-layer pattern placement distance.

An overlay metrology method is disclosed in accordance with one or more illustrative embodiments of the present disclosure. In one illustrative embodiment, the method includes fabricating a first layer of an overlay target on a sample including at least a pattern of device features and a pattern of reference features. In another illustrative embodiment, the method includes measuring, with an imaging system subsequent to fabricating the first layer, a first-layer pattern placement distance between the pattern of device features and the pattern of reference features on the first layer. In another illustrative embodiment, the method includes fabricating a second layer of the overlay target on the sample including at least the pattern of device features and the pattern of reference features. In another illustrative embodiment, the method includes measuring, with the imaging system subsequent to fabricating the second layer, a second-layer pattern placement distance between the pattern of device features and the pattern of reference features on the second layer. In another illustrative embodiment, the method includes measuring, with an overlay metrology tool, a reference overlay based on relative positions of the pattern of reference features on the first layer and the second layer in which dimensions of the pattern of reference features on the first layer are resolvable by the overlay metrology tool through the second layer. In another illustrative embodiment, the method includes determining a device-relevant overlay for the pattern of device-scale features by adjusting the reference overlay with a difference between the first-layer pattern placement distance and the second-layer pattern placement distance. In another illustrative embodiment, the method includes providing overlay correctables based on the device-relevant overlay to a lithography system to modify exposure conditions of at least one subsequent exposure.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3 is a conceptual view of a composite device-correlated overlay target, in accordance with one or more embodiments of the present disclosure.

DETAILED DESCRIPTION

Figure 1A:
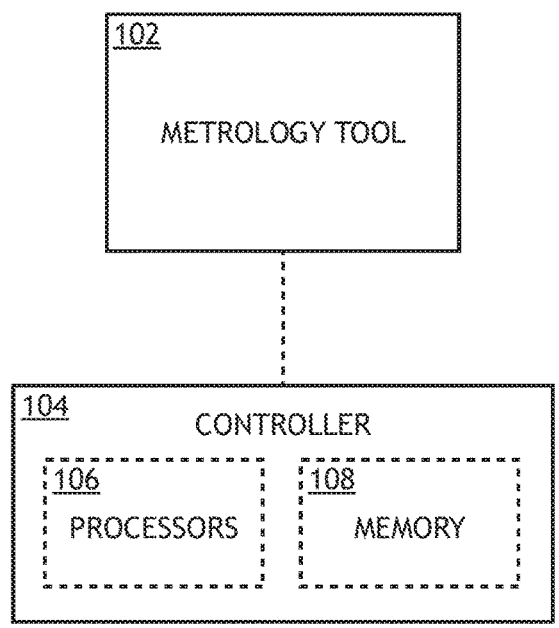
FIG. 1A is a conceptual view of an overlay metrology system suitable for device-correlated metrology measurements, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for measuring device-correlated overlay using overlay targets with stacked device-scale features based on a combination of intra-layer and inter-layer measurements. For example, an overlay target may include stacked device-scale features on multiple layers such that a device-relevant overlay measurement may be based on the relative positions of the device-scale features. However, direct measurement of the relative positions of stacked device-scale features may be impractical or undesirable.

It is recognized herein that a semiconductor device may by formed as multiple printed layers of patterned material on a substrate. Each printed layer may be fabricated through a series of process steps such as, but not limited to, one or more material deposition steps, one or more lithography steps, or one or more etching steps. Further, each printed layer must be fabricated within specific tolerances to properly construct the final device. For example, printing characteristics such as, but not limited to, the linewidths, sidewall angles, and relative placement of printed elements in each layer must be well characterized and controlled. Accordingly, metrology targets may be fabricated on one or more printed layers to enable efficient characterization of the fabrication process. In this regard, deviations of printed characteristics of metrology targets on a printed layer may be representative of deviations of printed characteristics of all printed elements on the layer including device features forming a portion of the semiconductor device.

It is recognized herein that various overlay metrology tools may be used to measure overlay. For example, optical metrology tools (e.g., light-based metrology tools using electromagnetic radiation for illumination and/or detection) may provide high-throughput overlay measurements using numerous techniques such as, but not limited to, determining relative positions of spatially-separated features on multiple layers in an image, directly measuring pattern placement errors (PPE) on multiple layers, or scatterometry in which overlay is determined based on light scattered and/or diffracted from diffraction gratings on multiple layers. For the purposes of the present disclosure, the term "optical metrology tools," "optical metrology techniques," and the like indicate metrology tools and techniques using electromagnetic radiation of any wavelength such as, but not limited to, x-ray wavelengths, extreme ultraviolet (EUV) wavelengths, vacuum ultraviolet (VUV) wavelengths, deep ultraviolet (DUV) wavelengths, ultraviolet (UV) wavelengths, visible wavelengths, or infrared (IR) wavelengths. However, resolution limits of optical metrology tools typically require feature sizes larger than device-scale features, which may introduce a systematic error between the optical metrology measurement and the actual overlay on device features of interest, depending on the wavelengths of an illumination source. By way of another example, particle-based metrology tools such as, but not limited to, a scanning electron microscope (SEM) metrology tool (e.g., a critical dimension SEM (CD-SEM), or the like), or a focused ion beam (FIB) metrology tool may resolve device-scale features. Further, particle-beam metrology tools may have a limited ability to simultaneously measure features on multiple sample layers based on the particle penetration depth. For example, low-energy particle beams may be used to characterize a top layer (e.g., a current layer), while relatively higher-energy particle beams may penetrate deeper into the sample to characterize features on previously-fabricated layers. However, many particle-based metrology tools may have relatively lower throughput than optical metrology tools and may potentially induce damage to one or more layers during measurement. Systems and methods for overlay measurement are generally described in U.S. Pat. No. 8,330,281 titled "OVERLAY MARKS, METHODS OF OVERLAY MARK DESIGN AND METHODS OF OVERLAY MEASUREMENTS" and issued on Dec. 11, 2012, U.S. Pat. No. 9,476,698 titled "PERIODIC PATTERNS AND TECHNIQUE TO CONTROL MISALIGNMENT BETWEEN TWO LAYERS" and issued on Oct. 25, 2016, U.S. Pat. No. 7,541,201 titled "APPARATUS AND METHODS FOR DETERMINING OVERLAY OF STRUCTURES HAVING ROTATIONAL OR MIRROR SYMMETRY" and issued on Jun. 2, 2009, U.S. Patent Publication No. 2014/0169861 titled "APPARATUS AND METHOD FOR DETECTING OVERLAY ERRORS USING SCATTEROMETRY" and published on Sep. 2, 2004, U.S. Patent Publication No. 2013/0035888 titled "METHOD AND SYSTEM FOR PROVIDING A QUALITY METRIC FOR IMPROVED PROCESS CONTROL" and published on Feb. 7, 2013, U.S. Pat. No. 9,214,317 titled "SYSTEM AND METHOD OF SEM OVERLAY METROLOGY" issued on Dec. 15, 2015, and PCT Application No. PCT/US2016/039531 titled "APPARATUS AND METHOD FOR THE MEASUREMENT OF PATTERN PLACEMENT AND SIZE OF PATTERN AND COMPUTER PROGRAM THEREFOR" and filed on Jun. 27, 2016, all of which are incorporated herein by reference in their entirety.

Embodiments of the present disclosure are directed to systems and methods for measuring device-correlated overlay using intra-layer measurements of device-scale features and reference features coupled with inter-layer overlay measurements of the reference features. Layers of an overlay target may thus include device-scale features suitable for intra-layer measurements as well as reference features suitable for both intra-layer and inter-layer measurements. Further, embodiments of the present disclosure are directed to overlay targets suitable for measuring overlay of any number of sample layers (e.g., two or more sample layers).

A device-correlated overlay ($OVL_{device}$) may thus be, but is not required to be, represented as:

$$OVL_{device} = OVL_{ref} + PPE, \quad (1)$$

where $OVL_{ref}$ is an inter-layer overlay measurement of reference features and PPE is a pattern placement error (PPE) associated with a difference between intra-layer pattern placement distances separating device-scale features and reference features in each layer of interest. For example, a device-correlated overlay measurement between a first layer and a second layer may be determined based on a measurement of a distance $D_1$ between a selected device-scale feature and a selected reference features on the first layer after the fabrication of the first layer, a measurement of a distance $D_2$ between a selected device-scale feature and a selected reference features on the second layer after the fabrication of the second layer, and a through-target overlay measurement $OVL_{ref}$ of reference features on the first and second layers. Accordingly, the device-relevant overlay may be expressed as:

$$OVL_{device} = OVL_{ref} + PPE = OVL_{ref} + (D_2 - D_1). \quad (2)$$

The reference features may have any dimensions and may be designed for any type of overlay measurement known in the art such as, but not limited to, optical overlay measurements, particle-based overlay measurements, or PPE measurements. In this regard, the reference features may have different dimensions than the device-scale features to facilitate inter-layer overlay measurements. For example, reference features suitable for optical measurement may have dimensions selected to be greater than the optical resolution of a selected optical metrology tool.

By way of another example, reference features suitable for particle-based measurement may have dimensions selected to be greater than a resolution of a selected particle-based metrology tool at each layer. It is recognized herein that the resolution of a particle-based metrology system may be higher for surface-level features than for sub-surface features located on sub-surface layers due to particle-sample interactions such as, but not limited to, particle scattering in the material. Accordingly, it may be the case that a particle-based metrology system may accurately resolve device-scale features on a surface layer, but may not accurately resolve (e.g., within selected tolerances) device-scale features on a sub-surface layer, particularly if the sub-surface features are stacked below the surface-level features. In this regard, the dimensions of the reference features on any layer may be selected to be resolvable by the metrology system within identified tolerances.

The pattern placement error PPE may be influenced by multiple factors. For example, as described previously herein, the placement of features within an exposure field of a lithography tool may be influenced by the size, shape, density, and/or orientation of the features. Accordingly, any differences between the reference features and the device-scale features on a given layer may result in pattern placement errors. By way of another example, intra-field fabrication errors may be induced by aberrations in a lithography tool during an exposure step such as, but not limited to, lens aberrations or turbulence caused by heat in the lithography tool.

It is to be understood that equation (2) above expressing overlay between two sample layers and the associated description is provided only for illustrative purposes and should not be interpreted as limiting. As described previously herein, device-correlated overlays may be generated for any number of sample layers. For example, the device correlated overlays of equations (1) and/or (2) may represent overlay between any two layers of a multi-layer overlay target. In this regard, through-target overlay measurements of reference features ($OVL_{ref}$) and PPE measurements may be generated for any number of sample layers to provide multi-layer device-correlated overlay measurements.

Additional embodiments of the present disclosure are directed to metrology targets with multiple patterns of device-scale features and one or more common reference features. In this regard, a common reference overlay measurement ($OVL_{ref}$) may be used to determine device-relevant overlay for each of the multiple patterns of device-scale features, which may facilitate high-throughput overlay measurements.

Additional embodiments of the present disclosure are directed to an overlay target including repeated sets of reference features. For example, an overlay target may include periodically distributed reference features located in multiple layers. In this regard, the reference overlay ($OVL_{ref}$) may be determined based on multiple measurements of the repeating features. Further, repeating features may facilitate reduced energy deposited per area on the overlay target and thus reduced potential for damage during the overlay measurement.

Further embodiments of the present disclosure are directed to generating device-relevant overlay correctables based on the device-relevant overlay measurements. The overlay correctables may then be provided to fabrication tools (e.g., lithography tools) as feedback and/or feedforward data. For example, overlay measurements associated with a current process step measured on a sample may be used to compensate for drifts and maintain overlay within selected tolerances for the process step on subsequent samples in the same or subsequent lots. By way of another example, overlay measurements associated with a current process step may be fed-forward to adjust subsequent process steps to compensate for any measured overlay errors.

FIG. 1A is a conceptual view of an overlay metrology system 100 suitable for device-correlated metrology measurements, in accordance with one or more embodiments of the present disclosure. In one embodiment, the overlay metrology system 100 includes at least one overlay metrology tool 102 suitable for measuring intra-layer pattern placement distances as well as inter-layer overlay measurements of stacked overlay target features.

In another embodiment, the overlay metrology system 100 includes a controller 104. In another embodiment, the controller 104 includes one or more processors 106 configured to execute program instructions maintained on a memory medium 108. In this regard, the one or more processors 106 of controller 104 may execute any of the various process steps described throughout the present disclosure. For example, the controller 104 may receive data from the overlay metrology tool 102 and may further generate device-correlated overlay data. By way of another example, the controller 104 may generate device-relevant overlay correctables based on data from the overlay metrology tool 102.

Further, the controller 104 may be communicatively coupled to one or more external fabrication tools such as, but not limited to, a lithography tool. In this regard, the controller 104 may operate as an advanced process controller (APC) suitable for controlling the inputs of the external fabrication tools to maintain overlay within selected overlay tolerances.

The one or more processors 106 of a controller 104 may include any processing element known in the art. In this sense, the one or more processors 106 may include any microprocessor-type device configured to execute algorithms and/or instructions. In one embodiment, the one or more processors 106 may consist of a desktop computer, mainframe computer system, workstation, image computer, parallel processor, or any other computer system (e.g., networked computer) configured to execute a program configured to operate the overlay metrology system 100, as described throughout the present disclosure. It is further recognized that the term "processor" may be broadly defined to encompass any device having one or more processing elements, which execute program instructions from a non-transitory memory medium 108. Further, the steps described throughout the present disclosure may be carried out by a single controller 104 or, alternatively, multiple controllers. Additionally, the controller 104 may include one or more controllers housed in a common housing or within multiple housings. In this way, any controller or combination of controllers may be separately packaged as a module suitable for integration into overlay metrology system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory (ROM), a random-access memory (RAM), a magnetic or optical memory device (e.g., disk), a magnetic tape, a solid-state drive, and the like. It is further noted that memory medium 108 may be housed in a common controller housing with the one or more processors 106. In one embodiment, the memory medium 108 may be located remotely with respect to the physical location of the one or more processors 106 and controller 104. For instance, the one or more processors 106 of controller 104 may access a remote memory (e.g., server), accessible through a network (e.g., internet, intranet, and the like). Therefore, the above description should not be interpreted as a limitation on the present invention but merely an illustration.

The overlay metrology tool 102 may include any type of metrology tool known in the art suitable for characterizing intra-layer pattern placement distances and/or inter-layer overlay measurements. For example, the overlay metrology tool 102 may illuminate a sample with an illumination beam and may further collect radiation emanating from the sample in response to the illumination beam. The illumination beam may include any type of illumination beam suitable for probing a sample such as, but not limited to, a light beam (e.g., photons), an electron beam, or an ion beam. Further, the radiation emanating from the sample may include photons, electrons, ions, neutral particles, or the like. Accordingly, the overlay metrology tool 102 may include an optical metrology tool, an e-beam metrology tool, an ion-beam metrology tool, or the like.

The overlay metrology tool 102 may further operate in either an imaging mode or a non-imaging mode. For example, the overlay metrology tool 102 operating in an imaging mode may illuminate a portion of the sample larger than the system resolution and capture one or more images of the illuminated portion of the sample on a detector. The captured image may be any type of image known in the art such as, but not limited to, a brightfield image, a darkfield image, a phase-contrast image, or the like. Further, captured images may be stitched together (e.g., by the controller 104, or the like) to form a composite image of the sample. By way of another example, the overlay metrology tool 102 may generate multiple images of the sample using multiple detectors either simultaneously or sequentially. For instance, the overlay metrology tool 102 may generate images of the sample from different perspectives. In another instance, the overlay metrology tool 102 may generate images of the sample using different beam energies (e.g., particle beam energies, optical intensities, wavelengths, or the like). By way of another example, the overlay metrology tool 102 may scan a focused beam across the sample and capture radiation and/or particles emanating from the sample on one or more detectors at one or more measurement angles to generate the image. The focused beam may be scanned across the sample by modifying the beam path and/or by translating the sample through a focal volume of the focused beam. For instance, particle beams may be scanned using controlled electromagnetic fields (e.g., generated using one or more beam deflectors, or the like). In another instance, light beams may be scanned using scanning mirrors (e.g., galvo mirrors, piezo-electric mirrors, or the like).

Figure 1B:
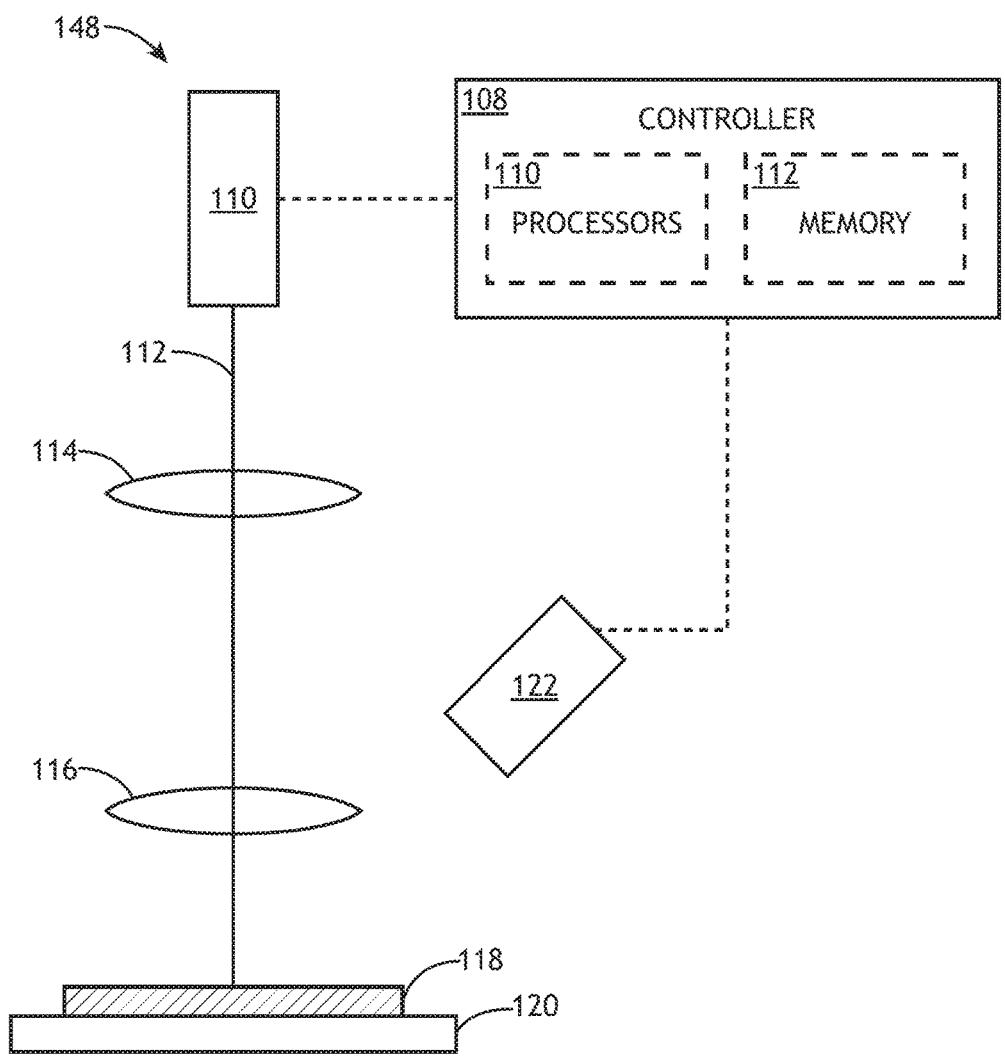
FIG. 1B is a conceptual view of a particle-based overlay metrology tool, in accordance with one or more embodiments of the present disclosure.
Figure 1C:
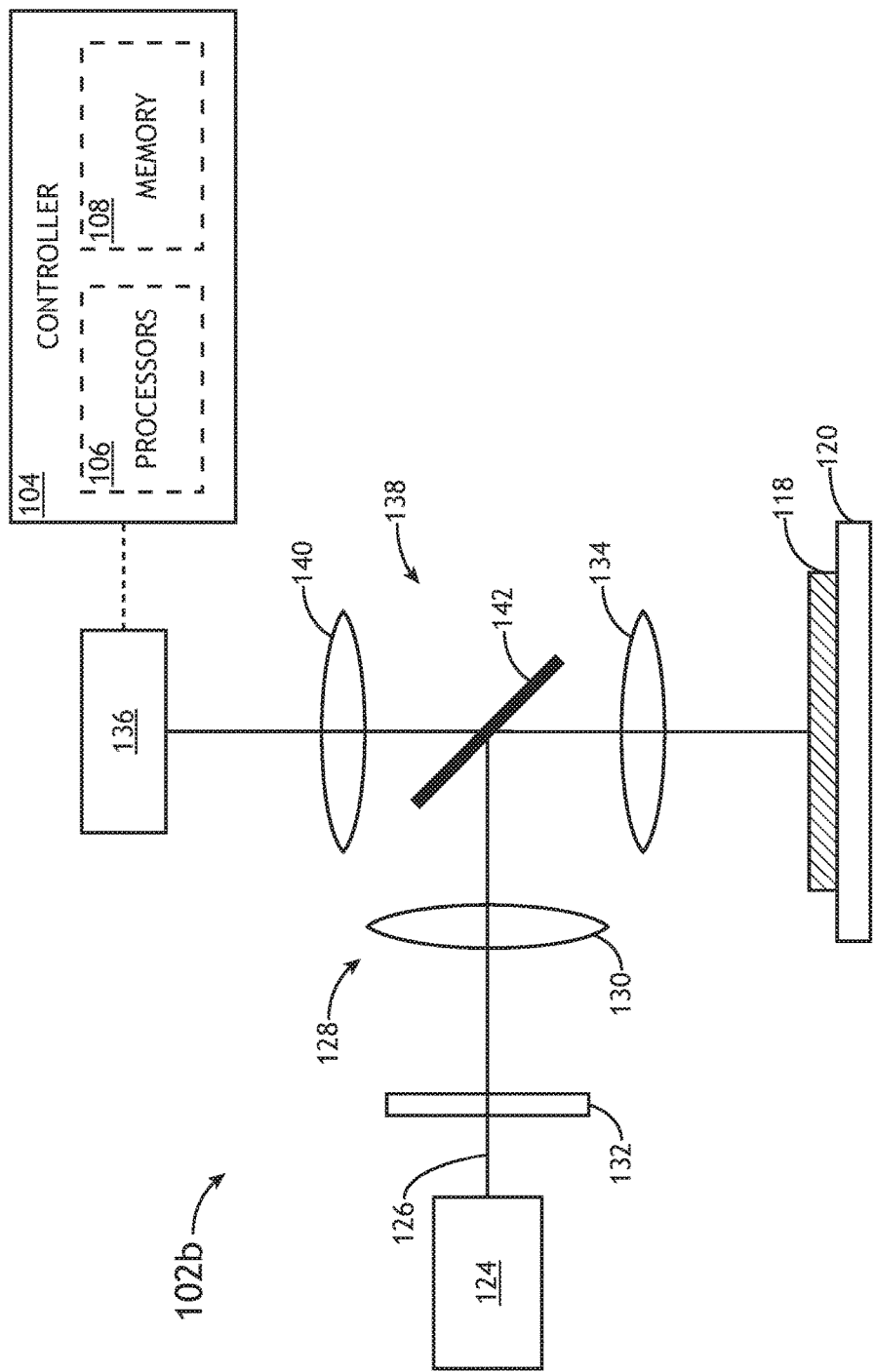
FIG. 1C is a conceptual view of an optical overlay metrology tool, in accordance with one or more embodiments of the present disclosure.

Referring now to FIGS. 1B and 1C, various embodiments of an overlay metrology tool 102 are described. For example, the overlay metrology tool 102 may include, but is not required to include, a particle-based overlay metrology tool 102a and/or an optical overlay metrology tool 102b.

FIG. 1B is a conceptual view of a particle-based overlay metrology tool 102a, in accordance with one or more embodiments of the present disclosure. The particle-based overlay metrology tool 102a may include any type of metrology tool suitable for resolving device features or device-scale features such as, but not limited to an electron-beam metrology tool (e.g., a SEM, a CD-SEM, or the like), or an ion-beam metrology tool (e.g., a focused-ion-beam (FIB) metrology tool).

In one embodiment, the particle-based overlay metrology tool 102a includes a particle source 110 (e.g., an electron beam source, an ion beam source, or the like) to generate a particle beam 112 (e.g., an electron beam, a particle beam, or the like). The particle source 110 may include any particle source known in the art suitable for generating a particle beam 112. For example, the particle source 110 may include, but is not limited to, an electron gun or an ion gun. In another embodiment, the particle source 110 is configured to provide a particle beam with a tunable energy. For example, particle source 110 including an electron source may, but is not limited to, provide an accelerating voltage in the range of 0.1 kV to 30 kV. As another example, a particle source 110 including an ion source may, but is not required to, provide an ion beam with an energy in the range of 1 to 50 keV.

In another embodiment, the particle-based overlay metrology tool 102a includes one or more particle focusing elements 114. For example, the one or more particle focusing elements 114 may include, but are not limited to, a single particle focusing element or one or more particle focusing elements forming a compound system. In another embodiment, the one or more particle focusing elements 114 include a particle objective lens 116 configured to direct the particle beam 112 to a sample 118 located on a sample stage 120. Further, the one or more particle elements 114 may include any type of electron lenses known in the art including, but not limited to, electrostatic, magnetic, uni-potential, or double-potential lenses.

In another embodiment, the particle-based overlay metrology tool 102a includes at least one particle detector 122 to image or otherwise detect particles emanating from the sample 118. In one embodiment, the particle detector 122 includes an electron collector (e.g., a secondary electron collector, a backscattered electron detector, or the like). In another embodiment, the particle detector 122 includes a photon detector (e.g., a photodetector, an x-ray detector, a scintillating element coupled to photomultiplier tube (PMT) detector, or the like) for detecting electrons and/or photons from the sample surface.

It is to be understood that the description of a particle-based overlay metrology tool 102a as depicted in FIG. 1B and the associated descriptions above are provided solely for illustrative purposes and should not be interpreted as limiting. For example, the particle-based overlay metrology tool 102a may include a multi-beam and/or a multi-column system suitable for simultaneously interrogating a sample 118. In a further embodiment, the particle-based overlay metrology tool 102a may include one or more components (e.g., one or more electrodes) configured to apply one or more voltages to one or more locations of the sample 118. In this regard, the particle-based overlay metrology tool 102a may generate voltage contrast imaging data.

It is recognized herein that the penetration depth of the particle beam 112 in the sample 118 may depend on the particle energy such that higher-energy beams typically penetrate deeper into the sample. In one embodiment, the particle-based overlay metrology tool 102a utilizes different particle energies to interrogate different layers of the device based on the penetration depth of the particle beam 112 into the sample 118. For example, the particle-based overlay metrology tool 102a may utilize a relatively low-energy electron beam (e.g., approximately 1 keV or less) and may utilize a higher energy beam (e.g., approximately 10 keV or higher) to characterize a previously fabricated layer. It is recognized herein that the penetration depth as a function of particle energy may vary for different materials such that the selection of the particle energy for a particular layer may vary for different materials.

FIG. 1C is a conceptual view of an optical overlay metrology tool 102b, in accordance with one or more embodiments of the present disclosure. The optical overlay metrology tool 102b may include any type of optical overlay metrology tool known in the art suitable for generating overlay data associated with two or more layers of a sample.

In one embodiment, the optical overlay metrology tool 102b includes an optical illumination source 124 to generate an optical illumination beam 126. The optical illumination beam 126 may include one or more selected wavelengths of light including, but not limited to, ultraviolet (UV) light, visible light, or infrared (IR) light.

The optical illumination source 124 may be any type of illumination source known in the art suitable for generating an optical illumination beam 126.

The optical illumination source 124 may include any type of illumination source suitable for providing an optical illumination beam 126. In one embodiment, the optical illumination source 124 is a laser source. For example, the optical illumination source 124 may include, but is not limited to, one or more narrowband laser sources, a broadband laser source, a supercontinuum laser source, a white light laser source, or the like. In this regard, the optical illumination source 124 may provide an optical illumination beam 126 having high coherence (e.g., high spatial coherence and/or temporal coherence). In another embodiment, the optical illumination source 124 includes a laser-sustained plasma (LSP) source. For example, the optical illumination source 124 may include, but is not limited to, a LSP lamp, a LSP bulb, or a LSP chamber suitable for containing one or more elements that, when excited by a laser source into a plasma state, may emit broadband illumination. In another embodiment, the optical illumination source 124 includes a lamp source. For example, the optical illumination source 124 may include, but is not limited to, an arc lamp, a discharge lamp, an electrode-less lamp, or the like. In this regard, the optical illumination source 124 may provide an optical illumination beam 126 having low coherence (e.g., low spatial coherence and/or temporal coherence).

In another embodiment, the optical illumination source 124 directs the optical illumination beam 126 to a sample 118 via an illumination pathway 128. The illumination pathway 128 may include one or more illumination pathway lenses 130 or additional optical components 132 suitable for modifying and/or conditioning the optical illumination beam 126. For example, the one or more optical components 132 may include, but are not limited to, one or more polarizers, one or more filters, one or more beam splitters, one or more diffusers, one or more homogenizers, one or more apodizers, or one or more beam shapers. The illumination pathway 128 may further include an objective lens 134 configured to direct the optical illumination beam 126 to the sample 118.

In another embodiment, the sample 118 is disposed on a sample stage 120. The sample stage 120 may include any device suitable for positioning and/or scanning the sample 118 within the optical overlay metrology tool 102b. For example, the sample stage 120 may include any combination of linear translation stages, rotational stages, tip/tilt stages, or the like.

In another embodiment, the optical overlay metrology tool 102b includes a detector 136 configured to capture light emanating from the sample 118 through a collection pathway 138. The collection pathway 138 may include, but is not limited to, one or more collection pathway lenses 140 for collecting light from the sample 118. For example, a detector 136 may receive light reflected or scattered (e.g., via specular reflection, diffuse reflection, and the like) from the sample 118 via one or more collection pathway lenses 140. By way of another example, a detector 136 may receive light generated by the sample 118 (e.g., luminescence associated with absorption of the optical illumination beam 126, or the like). By way of another example, a detector 136 may receive one or more diffracted orders of light from the sample 118 (e.g., 0-order diffraction, ±1 order diffraction, ±2 order diffraction, and the like).

The detector 136 may include any type of detector known in the art suitable for measuring illumination received from the sample 118. For example, a detector 136 may include, but is not limited to, a CCD detector, a TDI detector, a photomultiplier tube (PMT), an avalanche photodiode (APD), or the like. In another embodiment, a detector 136 may include a spectroscopic detector suitable for identifying wavelengths of light emanating from the sample 118.

The collection pathway 138 may further include any number of optical elements to direct and/or modify collected illumination from the sample 118 including, but not limited to one or more collection pathway lenses 140, one or more filters, one or more polarizers, or one or more beam blocks.

In one embodiment, the detector 136 is positioned approximately normal to the surface of the sample 118. In another embodiment, the optical overlay metrology tool 102b includes a beamsplitter 142 oriented such that the objective lens 134 may simultaneously direct the optical illumination beam 126 to the sample 118 and collect light emanating from the sample 118. Further, the illumination pathway 128 and the collection pathway 138 may share one or more additional elements (e.g., objective lens 134, apertures, filters, or the like).

The optical overlay metrology tool 102b may measure overlay based on any technique known in the art such as, but not limited to, imaged-based techniques or scatterometry-based techniques. Further, the optical overlay metrology tool 102b may measure overlay based on features on any layer of the sample 118 by having the optical illumination beam 126 propagate through a surface layer to interact with features on one or more previously fabricated layers.

In another embodiment, the overlay metrology tool 102 includes an edge-placement metrology tool suitable for measurements of the pattern placement distances (or pattern placement errors) of various features on a sample layer. For example, the position of the sample stage 120 may be tightly monitored to provide accurate positioning results over a large field of view. Further, it is recognized herein that positioning accuracy based on monitoring actual positions of the sample stage 120, as opposed to positioning accuracy based solely on control of the sample stage 120 itself, may be limited only by the monitoring accuracy. In one instance, though not shown, the position of the sample stage 120 along one or more directions is monitored using an interferometer, which may provide, but is not required to provide, nanometer or sub-nanometer accuracy. Further, the overlay metrology tool 102 including an edge-placement metrology tool may be based on any type of imaging technology such as, but not limited to, optical or particle-beam imaging. The measurement of the positions and dimensions of structures using edge-placement metrology is generally described in Intl Pub. No. WO 2018/004511 titled "APPARATUS AND METHOD FOR THE MEASUREMENT OF PATTERN PLACEMENT AND SIZE OF PATTERN AND COMPUTER PROGRAM THEREFOR" and published on Jan. 4, 2018, and U.S. Pat. No. 9,704,238 titled "METHOD FOR CORRECTING POSITION MEASUREMENTS FOR OPTICAL ERRORS AND METHOD FOR DETERMINING MASK WRITER ERRORS" and issued on Jul. 11, 2017, both of which are incorporated by reference herein in their entirety.

In another embodiment, the overlay metrology system 100 includes multiple overlay metrology tools 102. For example, the overlay metrology system 100 may include a first overlay metrology tool 102 suitable for measuring intra-layer pattern placement distances of device-scale features and a second overlay metrology tool 102 suitable for measuring inter-layer overlay. Further, the multiple overlay metrology tools 102 may have different operational principles. For example, an overlay metrology tool 102 suitable for measuring intra-layer pattern placement distances of device-scale features may include a particle-based metrology tool having sufficient resolution to resolve device-scale features. By way of another example, an overlay metrology tool 102 suitable for measuring inter-layer overlay may include either a particle-based metrology tool or an optical metrology tool.

Figure 2A:
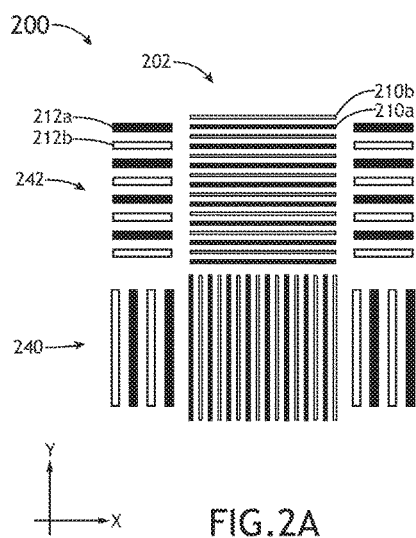
FIG. 2A includes a top view of a device-correlated overlay target, in accordance with one or more embodiments of the present disclosure.
Figure 2B:
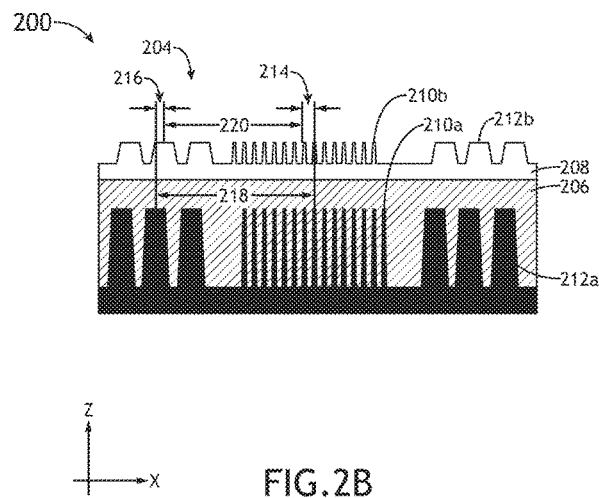
FIG. 2B includes a profile view a device-correlated overlay target, in accordance with one or more embodiments of the present disclosure.

FIG. 2A includes a top view 202 of a device-correlated overlay target 200, in accordance with one or more embodiments of the present disclosure. FIG. 2B includes a profile view 204 of a device-correlated overlay target 200, in accordance with one or more embodiments of the present disclosure. In one embodiment, the device-correlated overlay target 200 includes features on multiple layers of the sample 118. For example, as illustrated in the profile view 204, the device-correlated overlay target 200 may include features on a first layer 206 and a second layer 208 fabricated on top of and subsequent to the first layer 206.

In another embodiment, the device-correlated overlay target 200 includes both device-scale features and reference features on each layer of interest. For example, the device-correlated overlay target 200 may include a first-layer pattern of device-scale features 210a and a second-layer pattern of device-scale features 210b. Similarly, the device-correlated overlay target 200 may include a first-layer pattern of reference features 212a and a second-layer pattern of reference features 212b.

In another embodiment, the device-correlated overlay target 200 includes stacked (e.g., overlapping) patterns. For example, as illustrated in the profile view 204, the second-layer pattern of device-scale features 210b may be stacked on the first-layer pattern of device-scale features 210a such that a device-correlated overlay 214 may correspond to a relative displacement of the second-layer pattern of device-scale features 210b with respect to the first-layer pattern of device-scale features 210a. By way of another example, the second-layer pattern of reference features 212b may be stacked on the first-layer pattern of reference features 212a such that a reference overlay 216 may correspond to a relative displacement of the second-layer pattern of reference features 212b with respect to the first-layer pattern of reference features 212a.

In one embodiment, the first layer 206 and the second layer 208 include the same feature patterns. For example, the first-layer pattern of device-scale features 210a may be substantially the same as the second-layer pattern of device-scale features 210b across the device-correlated overlay target 200. Similarly, the first-layer pattern of reference features 212a may be substantially the same as the second-layer pattern of reference features 212b across the device-correlated overlay target 200. In another embodiment, the first layer 206 and the second layer 208 include different feature patterns. For example, features on the second layer 208 may be fabricated with a different period than features on the first layer 206. In one instance, as illustrated by the top view 202, features in the second layer 208 (e.g., the second-layer pattern of device-scale features 210b and the second-layer pattern of reference features 212b) may be fabricated with twice the period of features on the first layer 206 (e.g., the first-layer pattern of device-scale features 210a and the first-layer pattern of reference features 212a). In this regard, the features on the first layer may be alternately visible or covered in the top view 202. By way of another example, the first-layer pattern of device-scale features 210a and the second-layer pattern of device-scale features 210b may be fabricated with different characteristics such as, but not limited to, feature dimensions, (e.g., critical dimensions, lengths, widths, and/or heights), sidewall angles, or orientations.

In another embodiment, device-scale features are fabricated at a nominal selected distance (e.g., pattern placement distance) from the reference features. However, as described previously herein, intra-field errors can lead to variations in the relative placement of the device-scale features and the reference features. For example, as illustrated in the profile view 204 a first-layer pattern placement distance 218 associated with a separation between selected portions of the first-layer pattern of device-scale features 210a and the first-layer pattern of reference features 212a may differ from a second-layer pattern placement distance 220 associated with a separation between selected portions of the second-layer pattern of device-scale features 210b and the second-layer pattern of reference features 212b.

Accordingly, as described in equation 1, the device-correlated overlay 214 ($OVL_{device}$) may be characterized in terms of the reference overlay 216 ($OVL_{ref}$) and the PPE associated with a difference between the first-layer pattern placement distance 218 and the second-layer pattern placement distance 220.

The pattern placement distances (e.g., the first-layer pattern placement distance 218 and the second-layer pattern placement distance 220) may be determined using any technique known in the art. For example, the pattern placement distances may be determined by analyzing (e.g., with the controller 104) an image of at least a portion of the device-correlated overlay target 200 generated with a particle-based metrology tool (e.g., particle-based overlay metrology tool 102a) with a resolution sufficient to resolve the device-scale features.

Further, the reference overlay 216 ($OVL_{ref}$) may be determined using any technique known in the art. For example, the reference overlay 216 may be determined by analyzing (e.g., with the controller 104) an image of at least a portion of the device-correlated overlay target 200 generated with a particle-based metrology tool (e.g., particle-based overlay metrology tool 102a) with a resolution sufficient to resolve the reference features. By way of another example, the reference overlay 216 may be determined using an optical metrology tool (e.g., optical overlay metrology tool 102b). For instance, the controller 104 may analyze an optical image of the reference features on multiple layers of interest. In another instance, the controller 104 may determine the reference overlay 216 using a model-based analysis of a diffraction pattern associated with interaction of an optical illumination beam 126 with both the first-layer pattern of reference features 212a and the second-layer pattern of reference features 212b.

Figure 2C:
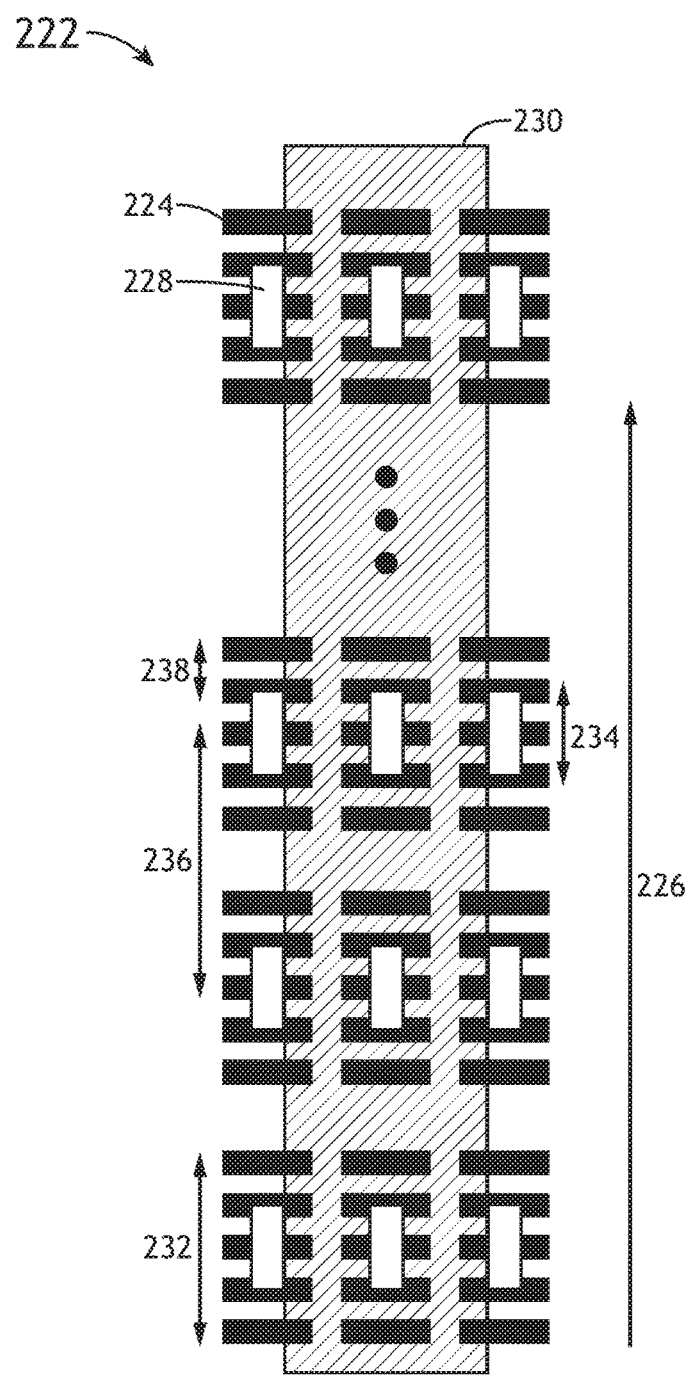
FIG. 2C is a top view of periodically-distributed reference features of an overlay target suitable for scanning measurements, in accordance with one or more embodiments of the present disclosure.

In another embodiment, a pattern of reference features (e.g., the first-layer pattern of reference features 212a and the second-layer pattern of reference features 212b) may be periodically distributed along a scan direction. The repeated reference features may provide multiple measurement points for the reference overlay 216 along the scan direction, which may reduce stochastic measurement noise compared to a single measurement and thus increase the measurement accuracy. Conversely, repeated reference features may reduce a dose on the sample during an overlay measurement (e.g., associated with a particle beam 112, an optical illumination beam 126, or the like) required to generate an overlay measurement of a selected precision. Further, reducing the dose required for an overlay measurement may mitigate charging effects as well as resist shrinkage effects, which may further increase the measurement precision FIG. 2C is a top view 222 of periodically-distributed reference features of an overlay target (e.g., device-correlated overlay target 200, or the like) suitable for scanning measurements, in accordance with one or more embodiments of the present disclosure. In one embodiment, periodically distributed first-layer features 224 are located on a first layer of a sample (e.g., sample 118) along a scanning direction 226. In another embodiment, periodically-distributed second-layer features 228 are located on a second layer of the sample along the scanning direction 226. Further, as illustrated in FIG. 2C, the second-layer features 228 may be stacked on the first-layer features 224 such that a swath 230 of an imaging beam (e.g., a particle beam 112, an optical illumination beam 126, or the like) may simultaneously image both the first-layer features 224 and the second-layer features 228.

The reference features may have dimensions selected to be greater than a resolution of a selected overlay metrology tool (e.g., the particle-based overlay metrology tool 102a, the optical overlay metrology tool 102b, or the like) such that the features may be resolved by the overlay metrology tool. For example, a length 232 of first-layer features 224 along the scanning direction 226, a length 234 of second-layer features 228 along the scanning direction 226, and/or the pitch 236 along the scanning direction 226 may be selected such that the first-layer features 224 and the second-layer features 228 are resolvable with the selected overlay metrology tool.

The reference features on any layer may be further segmented. For example, the reference features on all layers of the overlay target may be periodically distributed with a resolvable pitch 236 and reference features on any layer of the target may be further segmented with a device-scale pitch 238 to provide process-compatibility with design rules of the layer and minimize systematic placement errors between the reference features and device features on the layer. As described previously herein, the resolution of a particle-based overlay metrology tool 102a may be lower for sub-surface features (e.g., first-layer features 224) relative to surface-level features (e.g., second-layer features 228) such that the segments separated with the device-scale pitch 238 may not be resolvable with the overlay metrology tool. However, so long as the pitch 236, the length 232 of the first-layer features 224, and the length 234 of the second-layer features 228 are resolvable, the reference overlay 216 may be measured.

The device-correlated overlay target 200 may be further configured to facilitate overlay measurements in multiple directions. For example, the profile view 204 illustrates the determination of overlay along the X-direction. In one embodiment, as illustrated by the top view 202, the device-correlated overlay target 200 includes a first set of features 240 oriented along the X-direction suitable for overlay measurements along the X-direction and a second set of features 242 oriented along the Y-direction suitable for overlay measurements along the Y-direction.

A device-correlated overlay target may additionally include multiple sets of different device-scale feature patterns and/or multiple sets of different reference feature patterns. For the purposes of the present disclosure, such an overlay target is referred to as a composite overlay target. It is recognized herein that a fabricated layer may include device features (e.g., forming part of a semiconductor device) with varying dimensions, densities, and/or orientations. Accordingly, the varying dimensions, densities and/or orientations of the device features may lead to varying pattern placement error and thus varying on-device overlay. In one embodiment, a composite device-correlated overlay target may include different device-scale feature patterns to correspond to different device structures on a given layer. In this regard, device-correlated overlay may be measured for each type of device-scale feature pattern to facilitate robust and accurate overlay measurements for multiple device structures.

Similarly, a composite device-correlated overlay target may include multiple sets of reference feature patterns. In this regard, overlay may be measured based on any selected combination of device-scale feature patterns and reference feature patterns.

FIG. 3 is a conceptual view of a composite device-correlated overlay target 300, in accordance with one or more embodiments of the present disclosure. In one embodiment, the composite device-correlated overlay target 300 includes multiple device-scale patterns 302a-g. In another embodiment, the composite device-correlated overlay target 300 includes multiple reference patterns 304a,b. The multiple device-scale patterns 302a-g as well as the multiple reference patterns 304a,b may be distributed in any spatially-separated orientation. For example, as illustrated in FIG. 3, the composite device-correlated overlay target 300 may be divided into a grid in which each segment of the grid includes a device-scale pattern and/or a reference pattern.

In one embodiment, a device-correlated overlay measurement may be generated between any device-scale patterns 302a-g and any reference patterns 304a,b. In this regard, a selected device-scale patterns 302a-g and a selected reference patterns 304a,b may be considered in combination as a device-correlated overlay target (e.g., similar to the device-correlated overlay target 200 illustrated in FIG. 3, but not limited to the specific design illustrated in FIG. 3). Accordingly, a device-correlated overlay measurement may be generated based on equation 1 and the illustrative description of the device-correlated overlay target 200 of FIG. 3.

Further, the device-scale patterns 302a-g and the reference patterns 304a,b may include features oriented along any direction. For example, each device-scale patterns 302a-g or the reference patterns 304a,b may include features distributed along multiple directions suitable for the determination of overlay along the multiple directions. By way of another example, device-scale patterns 302a-g or the reference patterns 304a,b may include features distributed along a single direction.

It is recognized herein that a composite device-correlated overlay target (e.g., composite device-correlated overlay target 300) may facilitate efficient measurement of device-correlated overlay values for multiple device-scale patterns. For example, a single reference overlay measurement (e.g., $OVL_{ref}$) associated with any of reference patterns 304a,b may be applied to determine multiple device-relevant overlays of multiple device patterns.

Further, device-correlated overlay measured with different combinations of device-scale patterns and reference patterns may facilitate the determination of systematic fabrication errors such as, but not limited to, aberrations of the lithography system.

It is to be understood that the composite device-correlated overlay target 300 illustrated in FIG. 3 is provided solely for illustrative purposes and should not be interpreted as limiting. For example, a composite device-correlated overlay target 300 may have any shape suitable for including multiple device-scale feature patterns and/or reference feature patterns such as, but not limited to, a rectangle or a circle.

Figure 4:
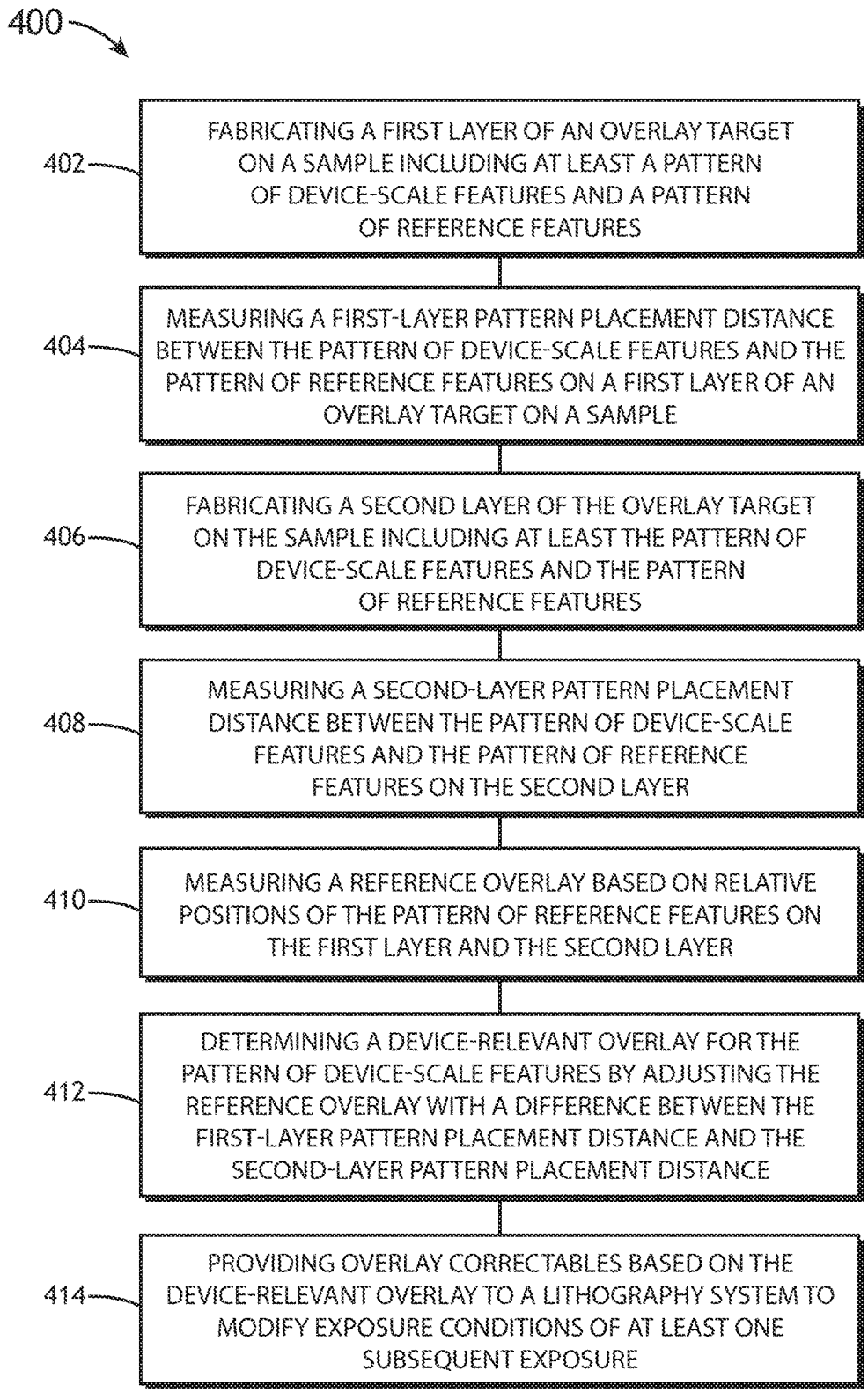
FIG. 4 is a flow diagram illustrating steps performed in a method for measuring device-correlated overlay, in accordance with one or more embodiments of the present disclosure.

FIG. 4 is a flow diagram illustrating steps performed in a method 400 for measuring device-correlated overlay, in accordance with one or more embodiments of the present disclosure. Applicant notes that the embodiments and enabling technologies described previously herein in the context of the overlay metrology system 100 should be interpreted to extend to method 400. It is further noted, however, that the method 400 is not limited to the architecture of the overlay metrology system 100.

In one embodiment, the method 400 includes a step 402 of fabricating a first layer of an overlay target on a sample including at least a pattern of device-scale features and a pattern of reference features. For example, an overlay target may include device-scale features that have one or more characteristics (e.g., size, shape, density, orientation, or the like) similar to device features forming a portion of a semiconductor device on the first layer. In this regard, the device-scale features may print with similar characteristics as the device features. The overlay target may additionally include reference features having selected characteristics (e.g., size, shape, density, orientation, or the like) suitable for providing inter-layer overlay measurements with corresponding features in subsequent layers. Further, the characteristics of the reference features that may differ, but are not required to differ, from the characteristics of the device-scale features.

In another embodiment, the method 400 includes a step 404 of measuring, with an imaging system subsequent to fabricating the first layer, a first-layer pattern placement distance between the pattern of device-scale features and the pattern of reference features on the first layer. The first-layer pattern placement distance may be measured using any technique known in the art. For example, the step 404 may include generating one or more images of the device-scale features and the reference features on the first layer and determining the first-layer pattern placement distance based on the one or more images.

In one embodiment, the imaging system used in step 404 is a particle-based imaging system (e.g., particle-based overlay metrology tool 102a, or the like) suitable for resolving the device-scale features.

In another embodiment, the method 400 includes a step 406 of fabricating a second layer of the overlay target on the sample including at least the pattern of device features and the pattern of reference features. For example, the pattern of device-scale features and the pattern of reference features may be duplicated on the second layer. In one embodiment, the device-scale features on the first and second layers are stacked (e.g., overlapped). In this regard, a device-correlated overlay may be associated with a relative displacement of the device-scale features on the second layer with respect to the first layer. Similarly, the pattern of reference features on the first and second layers may be stacked such that a reference overlay may be associated with a relative displacement of the reference features on the second layer with respect to the first layer.

In another embodiment, the method 400 includes a step 408 of measuring, with the imaging system subsequent to fabricating the second layer, a second-layer pattern placement distance between the pattern of device features and the pattern of reference features on the second layer. For example, the step 408 may be substantially similar to the step 404 repeated on the second layer. In one embodiment, first-layer pattern placement distance and the second-layer pattern placement distance may be measured using the same imaging system to provide consistent measurements.

In another embodiment, the method 400 includes a step 410 of measuring, with an overlay metrology system, a reference overlay based on relative positions of the pattern of reference features on the first layer and the pattern of reference features on the second layer.

The reference overlay may be measured using any overlay technique known in the art. For example, the reference overlay may be measured using a particle-based overlay tool (e.g., particle-based overlay metrology tool 102a, or the like). In this regard, the particle-based overlay metrology tool may utilize different particle energies to interrogate different layers of the device based on the penetration depth of a particle beam into the sample. For example, the particle-based overlay metrology tool may utilize a relatively low-energy electron beam (e.g., approximately 1 keV or less) and may utilize a higher energy beam (e.g., approximately 10 keV or higher) to characterize a previously fabricated layer. Further, the penetration depth as a function of particle energy may vary for different materials such that the selection of the particle energy for a particular layer may vary for different materials.

By way of another example, the reference overlay may be measured using optical metrology techniques such as, but not limited to, optical imaging metrology or scatterometry overlay metrology. In this regard, the reference features on the first and the second layers may be fabricated with dimensions greater than the optical resolution of the selected optical overlay metrology tool. As described previously herein, optical metrology techniques may utilize any wavelength of electromagnetic radiation such as, but not limited to, x-ray wavelengths, extreme ultraviolet (EUV) wavelengths, vacuum ultraviolet (VUV) wavelengths, deep ultraviolet (DUV) wavelengths, ultraviolet (UV) wavelengths, visible wavelengths, or infrared (IR) wavelengths.

In another embodiment, the reference features on the first layer and the second layer are periodically distributed along a scan direction. In this regard, the reference overlay may be measured along the scan direction and may provide multiple measurement points for the reference overlay, which may reduce stochastic measurement noise. Accordingly, the dose required to generate the reference overlay measurement may be decreased relative to non-repeating structures, which may mitigate errors associated with the measurement itself such as, but not limited to, charging effects and resist-layer shrinkage.

In another embodiment, the method 400 includes a step 412 of determining a device-relevant overlay for the pattern of device-scale features by adjusting the reference overlay with a difference between the first-layer pattern placement distance and the second-layer pattern placement distance. For example, as described previously herein with respect to equation 1, a device-relevant overlay ($OVL_{device}$) may be characterized in terms of the reference overlay ($OVL_{ref}$) associated with step 410 and the ΔPPE associated with a difference between the first-layer pattern placement distance of step 404 and the second-layer pattern placement distance of step 408.

In another embodiment, the method 400 includes a step 414 of providing overlay correctables based on the device-relevant overlay to a lithography system to modify exposure conditions of at least one subsequent exposure.

For example, step 414 may include generating control parameters (or corrections to the control parameters) for fabrication tools such as, but not limited to, lithography tools based on the device-relevant overlay. The control parameters may be generated by a control system such as, but not limited to, the controller 104 of the overlay metrology system 100. The overlay correctables may be provided as part of a feedback and/or a feedforward control loop. In one embodiment, the device-relevant overlay measurements associated with a current process step measured on a sample are used to compensate for drifts of one or more fabrication processes and may thus maintain overlay within selected tolerances across multiple exposures on subsequent samples in the same or different lots. In another embodiment, the device-relevant overlay measurements associated with a current process step may be fed-forward to adjust subsequent process steps to compensate for any measured overlay errors. For example, the exposure of patterns on subsequent layers may be adjusted to match the measured overlay of the subsequent layers.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:
1. An overlay metrology system, comprising:
   a controller including one or more processors configured to execute program instructions causing the one or more processors to:
      measure a first-layer pattern placement distance between a pattern of device features and a pattern of reference features on a first layer of an overlay target on a sample;
      measure, subsequent to fabricating a second layer including at least the pattern of device features and the pattern of reference features, a second-layer pattern placement distance between the pattern of device features and the pattern of reference features on the second layer;

measure a reference overlay based on relative positions of the pattern of reference features on the first layer and the second layer, wherein dimensions of the pattern of reference features on the first layer are resolvable by an imaging system through the second layer; and determine a device-relevant overlay for the pattern of device features by adjusting the reference overlay with a difference between the first-layer pattern placement distance and the second-layer pattern placement distance.

2. The overlay metrology system of claim 1, wherein the one or more processors are further configured to execute program instructions causing the one or more processors to:

provide overlay correctables based on the device-relevant overlay to a lithography system to modify exposure conditions of at least one subsequent exposure.

3. The overlay metrology system of claim 1, wherein the pattern of device features is a first pattern of device features, wherein the overlay target includes one or more additional patterns of device features fabricated on the first layer and the second layer, wherein the one or more processors are further configured to execute program instructions causing the one or more processors to:

measure, prior to fabricating the second layer, one or more additional first-layer pattern placement distances between the one or more additional patterns of device features and the pattern of reference features on the first layer;

measure, subsequent to fabricating the second layer, one or more second-layer pattern placement distances between the one or more additional patterns of device features and the pattern of reference features on the second layer; and determining device-relevant overlays for the one or more additional patterns of device features by adjusting the reference overlay with differences between the one or more additional first-layer pattern placement distances and the respective one or more additional second-layer pattern placement distances.

4. The overlay metrology system of claim 3, wherein the first pattern of device features and the one or more additional sets of device features are spatially separated on the overlay target.

5. The overlay metrology system of claim 3, wherein the pattern of device features on the first layer and the second layer overlap.

6. The overlay metrology system of claim 5, wherein the reference features on the first layer and the second layer overlap.

7. The overlay metrology system of claim 3, wherein the pattern of device features on the first layer and the second layer are spatially separated on the overlay target.

8. The overlay metrology system of claim 7, wherein the reference features on the first layer and the second layer overlap.

9. The overlay metrology system of claim 1, wherein the pattern of reference features is a first pattern of reference features, wherein the overlay target includes one or more additional patterns of reference features fabricated on the first layer and the second layer, wherein the one or more processors are further configured to execute program instructions causing the one or more processors to:

measure, prior to fabricating the second layer, one or more additional first-layer pattern placement distances between the pattern of device features and the one or more additional patterns of reference features on the first layer;

measure, subsequent to fabricating the second layer, one or more additional reference overlays based on relative positions of the one or more additional patterns of reference features on the first layer and the second layer, wherein dimensions of the one or more additional patterns of reference features on the first layer are resolvable by the imaging system through the second layer;

measure, subsequent to fabricating the second layer, one or more second-layer pattern placement distances between the pattern of device features and the one or more additional patterns of reference features on the second layer; and determining one or more additional device-relevant overlays by adjusting the one or more additional reference overlays with differences between the one or more additional first-layer pattern placement distances and the respective one or more additional second-layer pattern placement distances.

10. The overlay metrology system of claim 9, wherein the first pattern of reference features and the one or more additional sets of reference features are spatially separated on the overlay target.

11. The overlay metrology system of claim 1, wherein the pattern of reference features includes two or more sets of features periodically distributed along a scan direction on the first layer and the second layer, wherein measuring the reference overlay based on relative positions of the pattern of reference features comprises:

generating one or more scan images of the two or more sets of features; and determining the reference overlay based on the two or more sets of features in the one or more scan images.

12. The overlay metrology system of claim 11, wherein at least some features of the pattern of reference features on the first layer are segmented with a pitch smaller than a resolution of the imaging system when imaged through the second layer.

13. The overlay metrology system of claim 11, wherein the one or more scan images comprise:

one or more scan images generated with at least one of different imaging angles, different beam energies, or different wavelengths.

14. The overlay metrology system of claim 1, wherein the imaging system comprises:

a particle-based imaging system.

15. The overlay metrology system of claim 14, wherein the particle-based imaging system comprises:

an electron-beam imaging system.

16. The overlay metrology system of claim 14, wherein the particle-based imaging system comprises:

an ion-beam imaging system.

17. The overlay metrology system of claim 1, wherein the imaging system comprises:

an optical imaging system.

18. The overlay metrology system of claim 1, wherein the imaging system comprises:

two or more imaging systems.

19. An overlay metrology system, comprising:

an imaging system; and a controller communicatively coupled to the imaging system, the controller including one or more processors configured to execute program instructions causing the one or more processors to:
  measure a first-layer pattern placement distance between a pattern of device features and a pattern of reference features on a first layer of an overlay target on a sample after fabricating the first layer;
  measure, subsequent to fabricating a second layer including at least the pattern of device features and the pattern of reference features, a second-layer pattern placement distance between the pattern of device features and the pattern of reference features on the second layer;
  measure a reference overlay based on relative positions of the pattern of reference features on the first layer and the second layer, wherein dimensions of the pattern of reference features on the first layer are resolvable by the imaging system through the second layer; and
  determine a device-relevant overlay for the pattern of device features by adjusting the reference overlay with a difference between the first-layer pattern placement distance and the second-layer pattern placement distance.

20. The overlay metrology system of claim 19, wherein the one or more processors are further configured to execute program instructions causing the one or more processors to:
  provide overlay correctables based on the device-relevant overlay to a lithography system to modify exposure conditions of at least one subsequent exposure.

21. The overlay metrology system of claim 19, wherein the pattern of device features is a first pattern of device features, wherein the overlay target includes one or more additional patterns of device features fabricated on the first layer and the second layer, wherein the one or more processors are further configured to execute program instructions causing the one or more processors to:
  measure, prior to fabricating the second layer, one or more additional first-layer pattern placement distances between the one or more additional patterns of device features and the pattern of reference features on the first layer;
  measure, subsequent to fabricating the second layer, one or more second-layer pattern placement distances between the one or more additional patterns of device features and the pattern of reference features on the second layer; and
  determining device-relevant overlays for the one or more additional patterns of device features by adjusting the reference overlay with differences between the one or more additional first-layer pattern placement distances and the respective one or more additional second-layer pattern placement distances.

22. The overlay metrology system of claim 21, wherein the first pattern of device features and the one or more additional sets of device features are spatially separated on the overlay target.

23. The overlay metrology system of claim 21, wherein the pattern of device features on the first layer and the second layer overlap.

24. The overlay metrology system of claim 23, wherein the reference features on the first layer and the second layer overlap.

25. The overlay metrology system of claim 21, wherein the pattern of device features on the first layer and the second layer are spatially separated on the overlay target.

26. The overlay metrology system of claim 25, wherein the reference features on the first layer and the second layer overlap.

27. The overlay metrology system of claim 19, wherein the pattern of reference features is a first pattern of reference features, wherein the overlay target includes one or more additional patterns of reference features fabricated on the first layer and the second layer, wherein the one or more processors are further configured to execute program instructions causing the one or more processors to:
  measure, prior to fabricating the second layer, one or more additional first-layer pattern placement distances between the pattern of device features and the one or more additional patterns of reference features on the first layer;
  measure, subsequent to fabricating the second layer, one or more additional reference overlays based on relative positions of the one or more additional patterns of reference features on the first layer and the second layer, wherein dimensions of the one or more additional patterns of reference features on the first layer are resolvable by the imaging system through the second layer;
  measure, subsequent to fabricating the second layer, one or more second-layer pattern placement distances between the pattern of device features and the one or more additional patterns of reference features on the second layer; and
  determining one or more additional device-relevant overlays by adjusting the one or more additional reference overlays with differences between the one or more additional first-layer pattern placement distances and the respective one or more additional second-layer pattern placement distances.

28. The overlay metrology system of claim 27, wherein the first pattern of reference features and the one or more additional sets of reference features are spatially separated on the overlay target.

29. The overlay metrology system of claim 19, wherein the pattern of reference features includes two or more sets of features periodically distributed along a scan direction on the first layer and the second layer, wherein measuring the reference overlay based on relative positions of the pattern of reference features comprises:
  generating one or more scan images of the two or more sets of features; and
  determining the reference overlay based on the two or more sets of features in the one or more scan images.

30. The overlay metrology system of claim 29, wherein at least some features of the pattern of reference features on the first layer are segmented with a pitch smaller than a resolution of the imaging system when imaged through the second layer.

31. The overlay metrology system of claim 30, wherein the one or more scan images comprise:
  one or more scan images generated with at least one of different imaging angles, different beam energies, or different wavelengths.

32. The overlay metrology system of claim 19, wherein the imaging system comprises:
  a particle-based imaging system.

33. The overlay metrology system of claim 32, wherein the particle-based imaging system comprises:
  an electron-beam imaging system.

34. The overlay metrology system of claim 32, wherein the particle-based imaging system comprises:
  an ion-beam imaging system.

35. The overlay metrology system of claim 19, wherein the imaging system comprises:

an optical imaging system.

36. An overlay metrology method, comprising:

fabricating a first layer of an overlay target on a sample including at least a pattern of device features and a pattern of reference features;

measuring, with an imaging system subsequent to fabricating the first layer, a first-layer pattern placement distance between the pattern of device features and the pattern of reference features on the first layer;

fabricating a second layer of the overlay target on the sample including at least the pattern of device features and the pattern of reference features;

measuring, with the imaging system subsequent to fabricating the second layer, a second-layer pattern placement distance between the pattern of device features and the pattern of reference features on the second layer;

measuring, with an overlay metrology tool, a reference overlay based on relative positions of the pattern of reference features on the first layer and the second layer, wherein dimensions of the pattern of reference features on the first layer are resolvable by the overlay metrology tool through the second layer;

determining a device-relevant overlay for the pattern of device features by adjusting the reference overlay with a difference between the first-layer pattern placement distance and the second-layer pattern placement distance; and providing overlay correctables based on the device-relevant overlay to a lithography system to modify exposure conditions of at least one subsequent exposure.

* * * * *